United States Patent
Ishiwata et al.

[11] Patent Number: 5,701,544
[45] Date of Patent: Dec. 23, 1997

[54] PROCESS FOR PRODUCING COLOR FILTER

[75] Inventors: Kazuya Ishiwata, Yokosuka; Yasuyuki Watanabe, Chigasaki; Naoya Nishida, Hadano; Akira Unno, Hiratsuka, all of Japan

[73] Assignee: Canon Kabushiki Kaisha, Tokyo, Japan

[21] Appl. No.: 548,516

[22] Filed: Oct. 26, 1995

Related U.S. Application Data

[62] Division of Ser. No. 269,907, Jul. 6, 1994.

[30] Foreign Application Priority Data

Jul. 7, 1993 [JP] Japan ............... 5-191839
Jul. 7, 1993 [JP] Japan ............... 5-191840

[51] Int. Cl.$^6$ ............... G03D 3/02; G03D 5/00; G03D 3/08
[52] U.S. Cl. ............... 396/609; 396/611; 396/617; 396/622; 396/625; 396/630
[58] Field of Search ............... 354/624, 625, 354/617; 359/68, 79; 430/3, 7, 20; 396/609, 611, 612, 627, 633, 626, 602, 604, 630, 934, 935, 938, 940, 943, 946, 944; 134/198, 149, 151, 122 P

[56] References Cited

U.S. PATENT DOCUMENTS

| | | |
|---|---|---|
| 4,786,148 | 11/1988 | Sekimura et al. ............ 350/339 F |
| 5,278,009 | 1/1994 | Iida et al. ............ 430/7 |
| 5,294,505 | 3/1994 | Kamon ............ 430/3 |
| 5,374,493 | 12/1994 | Fukunaga et al. ............ 359/68 X |
| 5,422,207 | 6/1995 | Yoda ............ 430/7 |

FOREIGN PATENT DOCUMENTS

| | | | |
|---|---|---|---|
| 57-16407 | 1/1982 | Japan | ............ G02B 5/20 |
| 57-74707 | 5/1982 | Japan | ............ G02B 5/20 |
| 58-46325 | 3/1983 | Japan | ............ G02F 1/133 |
| 60-78401 | 3/1985 | Japan | ............ G02B 5/20 |
| 60-129707 | 7/1985 | Japan | ............ G02B 5/20 |
| 5-249694 | 9/1993 | Japan | ............ 396/944 |

*Primary Examiner*—D. Rutledge
*Attorney, Agent, or Firm*—Fitzpatrick, Cella, Harper & Scinto

[57] ABSTRACT

A color filter is produced through the steps of: forming a layer of a color filter material including a colorant dispersed in a photosensitive resin on a substrate; and pre-baking, exposing and developing the color filter material layer to leave a color filter pattern on the substrate. In the developing step, a developer liquid is applied in the form of a curtain onto the exposed color filter material layer on the substrate, the substrate is allowed to stand in a substantially still state and then the substrate is supplied with an ultrasonic wave projected perpendicularly to the substrate while being in contact with the developer liquid. The ultrasonic wave is preferably uniformized by at least two rotating reflection or diffusion plates before it is projected onto the substrate. As a result, the color filter pattern can be developed with little development irregularity even on a large-size substrate.

19 Claims, 5 Drawing Sheets

PROCESS FOR PRODUCING COLOR FILTER

This application is a division of application Ser. No. 08/269,907 filed Jul. 6, 1994.

FIELD OF THE INVENTION AND RELATED ART

The present invention relates to a process for producing a color filter, including a development step wherein a layer of a color filter material comprising a pigment dispersed in a photosensitive resin is patterned into a color filter pattern on a substrate.

There has been conventionally known a dyed color filter prepared by forming a mordant layer comprising a hydrophillic polymeric substance, such as gelatin, casein, glue or polyvinyl alcohol, and dyeing the colored layer with a dyestuff to form a colored layer.

Such a dyed color filter has an advantage in that there are many usable dyestuffs so that it is possible to easily obtain color filters having required spectral characteristics and hues. However, on the other hand it is accompanied with difficulties involving a wet step requiring a difficult control of dipping a mordant layer in a dyeing bath containing a dyestuff dissolved therein as well as a difficult step of providing a dye-preventing layer for each color, thus causing a lower yield. Further, available dyestuffs have a relatively low heat-resistant temperature of about 150° C. or lower so that it is difficult to use such a dyed color filter in case where a thermal treatment is applied to the color filter. Moreover, the dyed film per se is rather inferior in heat resistance and light fastness.

In contrast thereto, there has also been known a type of color filter comprising a colored resin containing a certain coloring matter dispersed in a transparent resin. For example, Japanese Laid-Open Patent Application (JP-A) 58-46325 and 60-78401 have proposed color filters comprising polyamide-based colored resin films. The polyamide-type resin per se is excellent in heat resistance and light-fastness but is non-photosensitive, so that the patterning thereof into a color filter pattern has to be performed by printing which is not suitable for minute pattern formation or by a complicated process of etching the colored resin film after forming a resist mask on the colored resin film.

On the other hand, JP-A 57-16407, JP-A 57-74707 and JP-A 60-129707 have disclosed color filters comprising colored resin films formed by mixing colorants within photosensitive resins, and the color filter formation including minute pattern forming can be performed through a simple process including ordinary photolithographic steps.

However, the color filter formation from a colored resin film comprising a mixture of a photosensitive resin and a colorant requires a considerably large exposure energy required for photocuring of the photosensitive resin since the colorant per se absorbs light in the exposure wavelength region.

In micro-patterning of such a colored resin film comprising a mixture of a photosensitive resin and a colorant, an ultrasonic wave is sometimes applied to the colored resin film during development after pre-baking in a developer liquid so as to apply a mechanical vibration with cavitation occurring in the developer liquid, thereby forming a uniform pattern.

An ultrasonic wave generally shows a strong directivity from the position of the ultrasonic oscillator or projector, and the performance of development of a colored resin film on a particularly large-area substrate can be largely affected by such factors as the disposition of the oscillator, the wavelength and the distance from the substrate.

Further, it has been also found that a certain difficulty which is not ordinarily caused arises in case of treating a larger substrate according to a conventional method as described above. For example, a considerable order of development irregularity is encountered in case of treating a substrate in a size of 450 mm-square or larger while the development irregularity is almost unnoticeable in treating an approximate 300 mm-square substrate. Such a defect becomes particularly noticeable when a developer liquid is supplied by showering or an ultrasonic wave is applied in combination instead of simple dipping for development.

More specifically, in case where a color filter material is prepared by dispersing a pigment in a polyamide- or polyimide-based photosensitive resin and also admixing therewith an adhesive agent or an adhesion promotor so as to enhance the adhesion with a glass substrate and a film of such a color filter material is desired to be developed in a short time, the showering of a developer liquid or the application of an ultrasonic wave is performed. In such an accelerated development method, the development irregularity is liable to become noticeable and severer when a larger substrate is treated.

SUMMARY OF THE INVENTION

In view of the above-mentioned problems of the prior art, an object of the present invention is to provide a process for producing a color filter whereby a color filter can be produced without causing a development irregularity or with little irregularity, if any, even formed on a large substrate of, e.g., one having a diagonal size of 17 inches or larger, particularly 20 inches or larger.

According to the present invention, there is provided a process for producing a color filter, comprising the steps of:

forming a layer of a color filter material comprising a colorant dispersed in a photosensitive resin on a substrate, pre-baking the color filter material layer, exposing the color filter material layer, developing the color filter material layer to leave a color filter pattern on the substrate, and post-baking the color filter pattern, wherein, in the developing step, a developer liquid is applied in the form of a curtain onto the exposed color filter material layer on the substrate, the substrate is allowed to stand in a substantially still state and then the substrate is supplied with an ultrasonic wave projected perpendicularly to the substrate while being in contact with the developer liquid.

According to another aspect of the present invention, there is provided a process for producing a color filter, comprising the steps of:

forming a layer of a color filter material comprising a colorant dispersed in a photosensitive resin on a substrate, pre-baking the color filter material layer, exposing the color filter material layer, developing the color filter material layer to leave a color filter pattern on the substrate, and post-baking the color filter pattern, wherein, in the developing step, the substrate carrying the exposed color filter material layer is dipped in a bath of a developer liquid so as to be covered with a layer of the developer liquid in a thickness of at least 0.2 mm, the substrate in the dipped state is allowed to stand still or move gently and then the substrate is supplied with an ultrasonic wave projected perpendicularly to the substrate while being in contact with the developer liquid.

According to still another aspect of the present invention, there is provided a process for producing a color filter, comprising the steps of:

forming a layer of a color filter material comprising a colorant dispersed in a photosensitive resin on a substrate, pre-baking the color filter material layer, exposing the color filter material layer, developing the color filter material layer to leave a color filter pattern on the substrate, and post-baking the color filter pattern, wherein, in the developing step, the substrate carrying the exposed color filter material layer is dipped in a bath of a developer liquid and is supplied with an ultrasonic wave projected from an ultrasonic projector and uniformized by at least two rotating plates capable of reflecting or diffusing the ultrasonic wave and disposed between the substrate and the ultrasonic projector.

According to a further aspect of the present invention, there is provided a developing apparatus for developing a pre-baked and exposed layer of a color filter material comprising a colorant dispersed in a photosensitive resin formed on a substrate to leave a color filter pattern on the substrate; said developing apparatus comprising:

a means for containing a developer liquid in which the substrate is dipped, a projection means for projecting a vibrating wave toward the substrate, and a means including at least two rotatable plates and disposed between the projection means and the substrate for reflecting or diffusing the vibrating wave.

These and other objects, features and advantages of the present invention will become more apparent upon a consideration of the following description of the preferred embodiments of the present invention taken in conjunction with the accompanying drawings.

DETAILED DESCRIPTION OF THE INVENTION

Figure 1A:
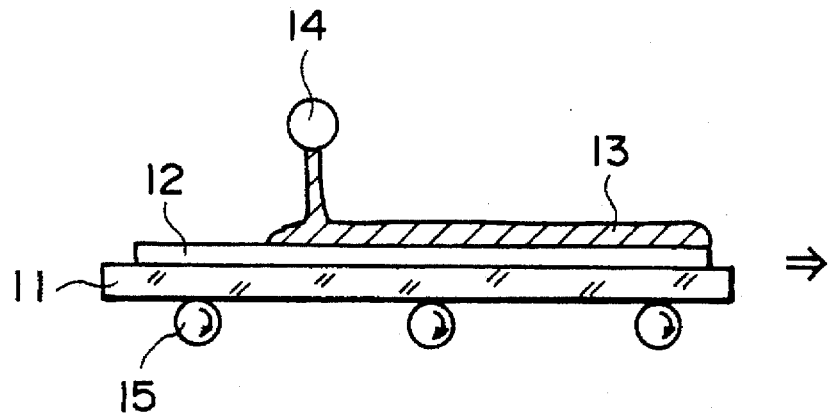
FIGS. 1A and 1B are side views for illustrating two steps involved in an embodiment of the process according to the present invention.
Figure 1B:
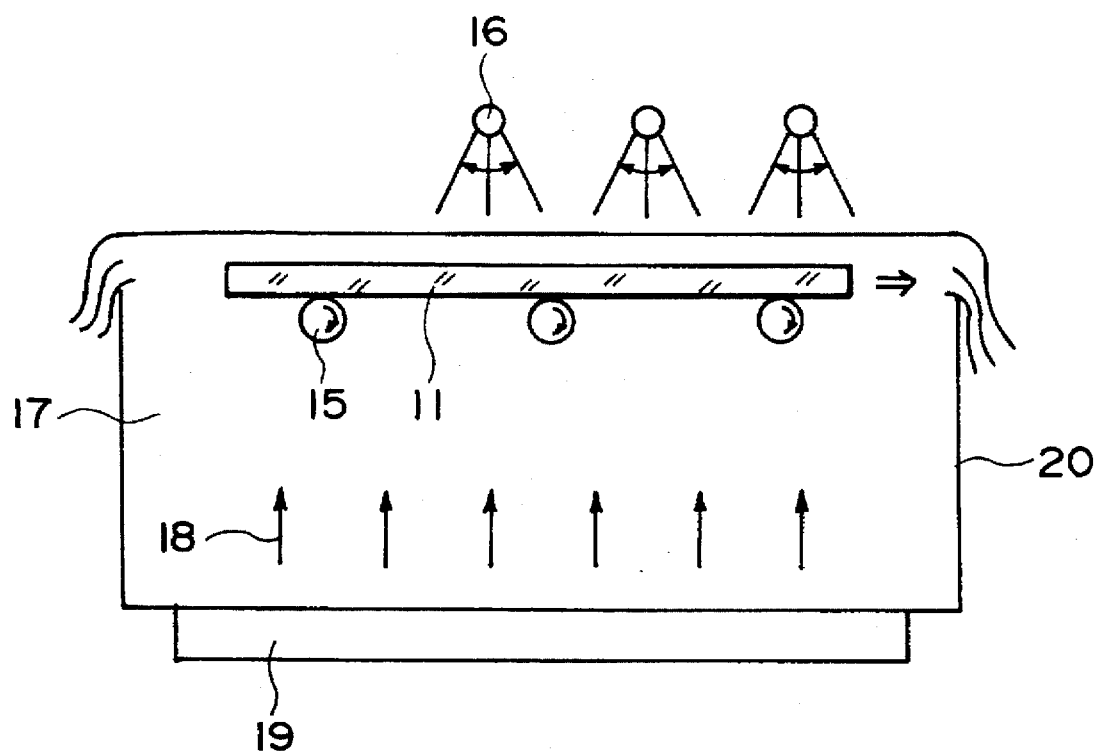

Referring to FIGS. 1A and 1B, in a first embodiment of the process for producing a color filter according to the present invention, a color filter material 12 prepared by dispersing a pigment in a photosensitive resin is applied onto a substrate 11 and pre-baked, followed by exposure, development and post-baking to form a patterned color filter. In the development step, onto the exposed layer 12 of the color filter material, a developer liquid 13 is applied from a developer liquid-dropping slit 14 as gently as possible, i.e., in an approximately laminar stream as shown in FIG. 1A, or the substrate is gently dipped in a developer liquid bath, and the substrate is left standing in contact with the developer liquid for sometime. The standing time may most preferably be ca. 20–60 sec. in view of an overall processing time and the developing irregularity of the resultant color filter material layer, but can exceed 60 sec.

After the standing, the substrate 11 carrying the color filter material layer is exposed to an ultrasonic wave. The ultrasonic wave may, for example, have a frequency ranging from 5 kHz to 10 MHz preferably 10 kHz to 1 MHz and a power of 0.5–6 kW and may be applied for ca. 0.5–5 min., preferably around 1 to 1.5 min. In this instance, the developer liquid standing on the substrate 11 may preferably be replaced with a developer liquid within a developing vessel by circulating the developer liquid to a moderate extent. Alternatively, it is also possible to shower a relatively fresh developer liquid onto the substrate. In the above-described manner, the developing irregularity can be minimized.

The application of an ultrasonic wave is particularly effective in case of forming a patterned color filter by development with a solvent-type developer liquid on a large size since it provides a fast developing rate or patterning speed and is suitable for mass production. According to the present invention, the developing irregularity is reduced and a further increased developing rate is provided in the system using an ultrasonic wave.

The developing mechanism giving the advantage of the present invention has not been fully clarified as yet. It is however assumed that a reaction between the color filter material and the developer liquid is allowed to proceed sufficiently by having the developer liquid stand on the color filter material layer for a period allowing the reaction, e.g., at least 20 sec. depending on the color filter material used, and then a patterning of the color filter material layer is effected at a stroke by application of a physical force exerted by application of the ultrasonic wave, so that the patterning can be effected without causing development irregularity.

In this embodiment, it is important that the developer liquid is allowed to stand on the color filter material layer and then an ultrasonic wave is applied thereto. The reverse order is not effective. The above embodiment is suitable for continuous, uniform and stable production of a color filter and is also suitable for mass production thereof.

Figure 3:
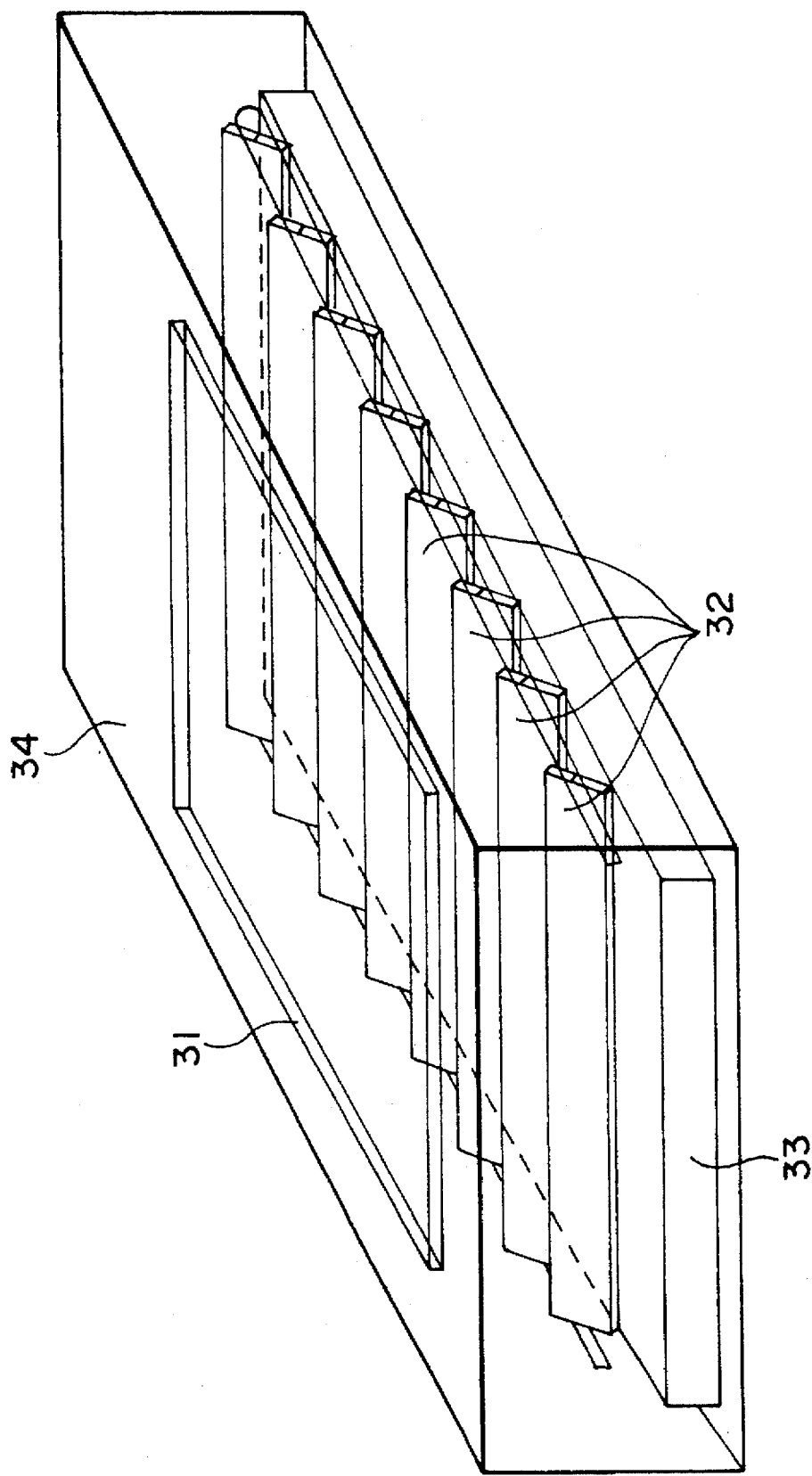
FIG. 3 is a perspective view illustrating a developing apparatus used in an embodiment of the present invention.

According to a second embodiment of the present invention, a layer of a color filter material comprising a colorant dispersed in a photosensitive resin is applied onto a substrate 31, pre-baked under heating, exposed and then patterned by development (e.g., as shown in FIG. 3) with a developer liquid 34 under application of an ultrasonic wave in a developing apparatus equipped with a movable reflection-and-diffusion plate or blade 32 disposed in the vicinity of the surface of an ultrasonic projector 33, particularly the part thereof wherein the oscillating element is embedded, of a dipped-in type (as shown in FIG. 3) or an ultrasonic oscillator disposed beneath the developing vessel.

It may be possible to embed oscillating elements at a higher density so as to obtain a uniform ultrasonic wave in the development step for providing a color filter, but there is posed a certain limit for the disposition density. Alternatively, the ultrasonic projector (device) or the substrate may be moved slidably relative to each other, but this may require a mechanically complicated system.

Moreover, the substrate after the development is subjected to a wet-treatment step, such as washing with a rinsing liquid. Accordingly, in order to successively effect a series of wet operations, it is desired that the substrate and the ultrasonic projector are held so as to keep a constant distance of, e.g., 20–50 mm, therebetween. By using ultrasonic wave reflection-and-diffusion plates 32 according to the present invention, the uniform application of a ultrasonic wave onto the color filter material layer disposed on a substrate can be performed, thereby allowing a uniform development, while keeping such a constant positional relationship between the substrate and the ultrasonic projector.

The ultrasonic wave may preferably have an oscillation frequency of 5 kHz to 1 MHz. Cavitation generally occurs at parts having distances which are a halfwave length multiplied by integers. Accordingly, too low a frequency provides a rather remote place of cavitation and is therefore undesirable from an apparatus view point.

The reflection-and-diffusion plates 32 may preferably have a thickness of at most 3 mm, particularly 1.0–1.5 mm. The thickness in excess of 3 mm is liable to cause absorption of the ultrasonic wave thereby. The reflection-and-diffusion plates 32 may for example comprise stainless steel and other metals which are resistant to solvents.

Figure 5:
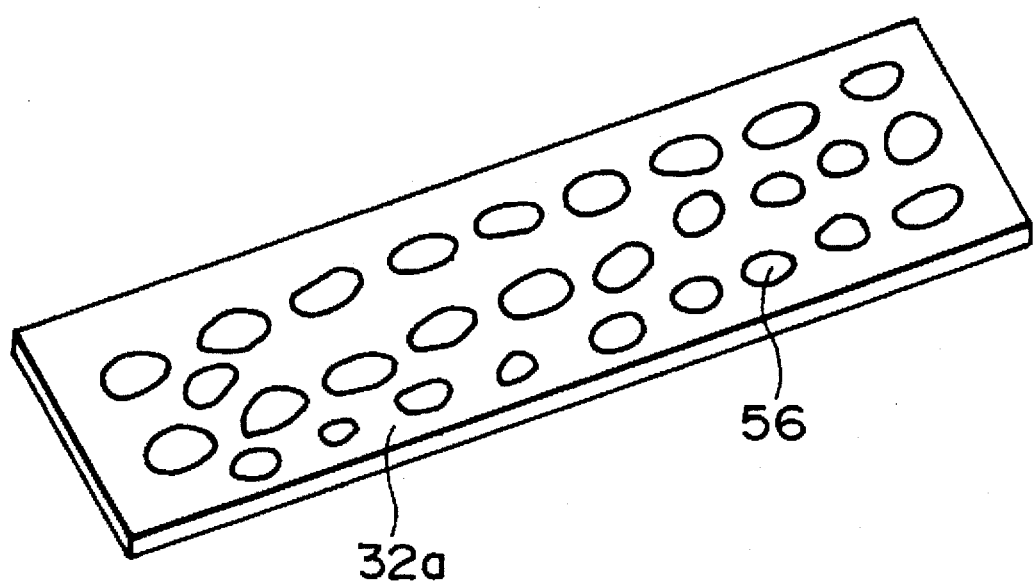
FIG. 5 is a perspective view of a reflection-diffusion plate used in an embodiment of the present invention.

The reflection-and-diffusion plates 32 may preferably be disposed in a number of at least two and may preferably be disposed rotatably, e.g., at a rotation speed of preferably 5–20 rpm. Each plate may preferably have a length sufficient to cover a substrate to be supplied with the ultrasonic wave and may preferably be inclined as shown with respect to the ultraviolet projection surface at an angle of 45 degrees or larger. The reflection-and-diffusion plate 32 can be provided with randomly disposed perforations 56 as shown in FIG. 5.

In the present invention, the photosensitive resin constituting a color filter material may preferably comprise a polyamide resin or a polyimide resin including a photosensitive group in its molecular structure as will be described hereinbelow so as to provide a color filter having excellent performances.

More specifically, the photosensitive resin may preferably be one which can provide a cured film at a temperature of 200° C. or below, e.g., under heating at 150° C. for 30 min. and shows substantially no absorption characteristic (in other words, provides a transmittance of at least ca. 90%) in the visible wavelength region of 400–700 nm. From this viewpoint, it is particularly preferred to use an aromatic polyamide resin.

The photosensitive group may preferably be an aromatic chain group having a photosensitive, unsaturated hydrocarbon group. Examples thereof may include bi-functional groups shown below:

(1) Benzoic acid ester groups as represented by the following formula:

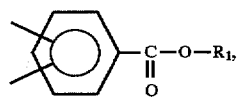

wherein $R_1$ denotes an unsaturated group represented by CHX=CY—COO—Z, wherein X denotes —H or —$C_6H_5$, Y denotes —H or —$CH_3$ and Z denotes —(a single bond), an ethylene group or a glycidylene group.

(2) Benzyl acrylate groups as represented by the following formula:

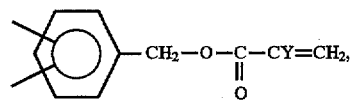

wherein Y denotes —H or —$CH_3$.

(3) Diphenyl ether groups as represented by the following formula:

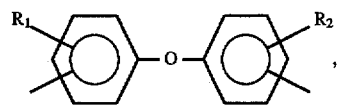

wherein $R_2$ denotes at least one of CHX=CY—CONH—, $CH_2$=CY—COO—$(CH_2)_2$—OCO and $CH_2$=CY—COO—$CH_2$, wherein X denotes —H or —$C_6H_5$, and Y denotes —H or —$CH_3$.

(4) Chalcone groups as represented by the following formula:

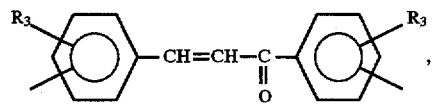

wherein $R_3$ denotes —H, alkyl group or alkoxy group.

(5) Other compound groups, as represented by the following formulae:

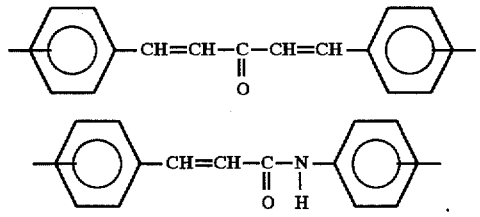

Examples of the aromatic polyamide resins and polyimide resins having photosensitive groups and described above may include those available under the trade names of "Lithocoat PA-1000" and "Lithocoat PI-400" (both available from Ube Kosan K.K.).

The above-mentioned photosensitive polyamides and polyimides are excellent not only in mechanical properties but also in durability properties, such as heat resistance, light-fastness and solvent resistance in the hardened state unlike conventional photosensitive resins used in photolithography, thereby providing a color filter excellent in such mechanical properties and durabilities.

The colorant to be used in combination with a photosensitive resin as described above for constituting a color filter material may be any materials inclusive of organic pigments, inorganic pigments and dyes, in so far as they provide a desired spectral characteristic. These colorants may be used singly or in mixture of two or more species. Even a dye which per se shows inferior durability to the pigments can provide a color filter having superior durability than a conventional dyed color filter when used in combination with the above-mentioned photosensitive resin. In view of the color characteristics and other performances of the resultant color filter, however, the organic pigment may most preferably be used as the colorant.

Examples of the organic pigment may include: azo type pigments inclusive of soluble azo-type, insoluble azo-type and condensed azo-type; phthalocyanine pigments; indigo-type pigments, anthraquinone-type pigments, perylene-type pigments, dioxane-type pigments, quinacridone-type pigments, isoindolinone-type pigments, phthalone-type pigments, methine and azomethine-type pigments, and other condensed polycyclic pigments inclusive of metal complex-types. These pigments may be used singly or in mixture of two or more species.

Hereinafter, the present invention will be described more specifically based on embodiments with reference to the drawings.

EXAMPLE 1

Referring to FIG. 1A, a transparent substrate 11 (which may have been provided with a metal pattern for masking, etc.) has been coated with a layer 12 of a color filter material comprising a colorant dispersed in a photosensitive resin (a photosensitive polyamide resin or a photosensitive polyimide resin) by spin coating, roller coating, etc., and then pre-baked. The color filter material layer 12 may ordinarily have a thickness in the range of 1.5 μm–2.0 μm while it can depend on the color characteristic desired. In case of a thickness of 1.7 μm for example, the color filter material layer 12 may be pre-baked, e.g., at 80° C. for 10 min. and then exposed at 200–800 mJ/cm$^2$. The exposure energy can vary depending on the kind and quantity of the pigment dispersed.

Then, the exposed color filter material layer 12 on the transparent substrate 11 is developed with a solvent-type developer liquid 13, such as ethyl cellosolve or γ-butyrolactone, which is allowed to fall down gently through a dropping slit 14 in the form of a curtain onto the color filter material layer 12 while horizontally moving the substrate 11 on conveyer rollers 15 so as to cover the entire surface of the color filter material layer 12. The developer liquid 13 may be allowed to stand on the color filter material layer 12 solely by the surface tension thereof for a period of 20–60 sec, preferably around 30 sec., and then the substrate 11 carrying thereon the color filter material layer 2 and the developer liquid 13 (as shown in FIG. 1A) is moved to a developing position and subjected to irradiation with an ultrasonic wave 18 through a developer liquid 17 in a developing vessel 20 while causing an overflow of the developer liquid as shown in FIG. 1B or showering a developer liquid through a showering nozzle 16 so as to provide a fresh developer liquid onto the color filter material layer 12. The irradiation or projection of the ultrasonic wave may preferably be performed for 20–90 sec., more preferably around 30 sec.

In this way, the color filter may be developed in a short period and with little development irregularity.

Hereinbelow, a more specific example is set forth.

A blue sheet glass in a size of 450 nm×550 nm was coated with a 1.7 μm-thick layer of a color filter material formed by dispersing a red pigment in a photosensitive polyamide ("PA-1000", available from Ube Kosan K.K.) by spin coating, followed by pre-baking at 80° C. for 10 min. by means of a hot plate.

Then, the pre-baked color filter material layer 12 was exposed to ultraviolet rays at a rate of ca. 400 mJ/cm$^2$ and then caused to be in contact with a developer liquid 13 comprising a mixture of ethyl cellosolve and α-butyrolactone which was allowed to fall down on the color filter material layer 12 in the form of a curtain close to a laminar flow through a dropping slit 14 while moving the substrate 11 at a rate corresponding to the falling rate of the developer liquid 13 so as to form a uniform layer of the developer liquid layer 13 on the entire surface of the color filter material layer 12. The developer liquid 13 remained in a layer thickness of ca. 2 mm only by its surface tension, and the substrate 11 carrying the developer liquid was moved to a subsequent ultrasonic wave application vessel 20 (FIG. 1B) within 30 sec after placement of the developer liquid layer 13. In the ultrasonic wave application vessel, the substrate 11 was fully dipped in a bath of a developer liquid 17 and covered with a part of the developer liquid 17 which was swollen and overflown out of the vessel 20. In this state, the substrate 11 was supplied with an ultrasonic wave of 25 kHz and a power of 2.2 kW for 30 sec.

Then, the substrate 11 after the development was transferred to a subsequent vessel for washing with a rinsing liquid, followed by removal of the rinsing liquid by blowing N$_2$ thereto and post-baking to form a red (R) color filter pattern on the substrate 11.

Then, the above cycle was repeated twice for preparation of green (G) and blue (B) color filter patterns on the substrate 11 while slightly changing the pre-baking energy, exposed quantity and development time depending on the colors.

The thus-prepared color filter having three color filter patterns of R, G and B was formed to have a good quality free from development irregularity.

EXAMPLE 2

Figure 2:
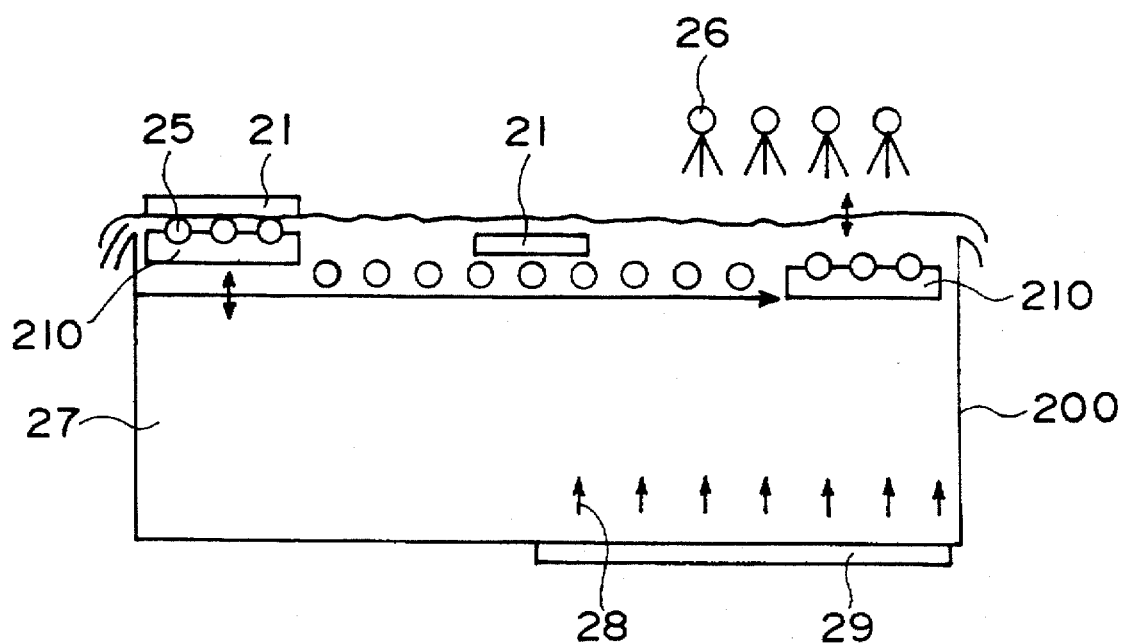
FIG. 2 is a side view for illustrating a step involved in another embodiment.

FIG. 2 illustrates a development step in another embodiment of the process for producing a color filter according to the present invention.

A substrate 21 carrying thereon a color filter material layer subjected to pre-baking and exposure in the same manner as in Example 1 is placed on an elevator stage 210 which can move up and down and is dipped in a bath of a developer 27 comprising a solvent, such as ethyl cellosolve or α-butyrolactone, held in a development vessel 200 so as to be covered with a layer of the developer liquid in a thickness of ca. 0.2 mm to 50 mm. Then, the substrate 21 is allowed to stand still or move very slowly by means of conveyer rollers for ca. 30 sec. and then supplied with an ultrasonic wave 28 from a projector 29 for ca. 30 sec.

In a specific example, the substrate 21 was allowed to stand still or move at a speed of at most 27.5 mm/sec while being covered with a ca. 5 mm-thick layer of the developer liquid 28 for ca. 30 sec. Then, the substrate 21 was moved to an ultrasonic wave application position within the development vessel 200, where the substrate 1 was supplied with an ultrasonic wave of 42 kHz for 30 sec. Then, the substrate 21 was taken out of the developing vessel 200 by means of an elevator plate 210. Then, the substrate 21 was subjected to rinsing, drying and post-baking in the same manner as in Example 1 to form an R color filter pattern on the substrate 21.

The above cycle was repeated to form G and B color filter patterns on the substrate 21, thereby completing a color filter. The resultant color filter was found to show a high quality free from development irregularity, similarly as in Example 1.

EXAMPLE 3

A color filter was prepared in a similar manner as in Example 1 as illustrated in FIGS. 1A and 1B.

In this Example, however, the substrate 11 was supplied with an ultrasonic wave 18 while showering the developer liquid through showering nozzles 16 onto the color filter material layer on the substrate 11 instead of overflowing the developer liquid 17 as in Example 1. The ultrasonic application was performed for ca. 30 sec.

In this way, a color filter having B, G and R color filter patterns on the substrate free from development irregularity was prepared in a shorter time for development.

EXAMPLE 4

Figure 4A:
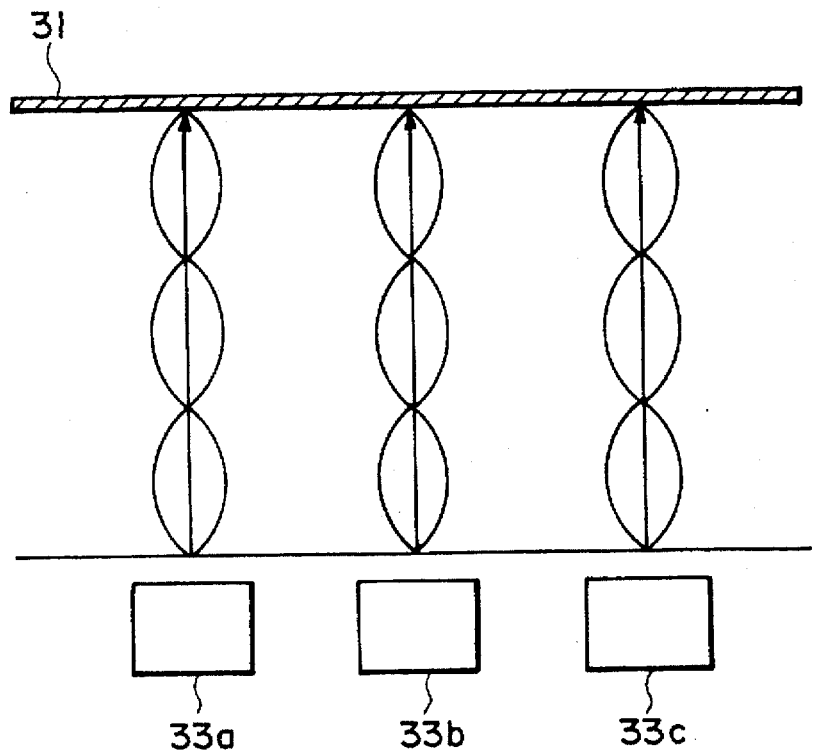
FIGS. 4A and 4B are schematic views for illustrating two states of reflection of ultrasonic waves in the apparatus shown in FIG. 3.

FIG. 3 illustrates a developing apparatus for producing a color filter according to the present invention. Referring to FIG. 3, the apparatus includes an ultrasonic wave generator or projector 33 and a reflection-and-diffusion plate 32 rotatably disposed on the projector 33. The ultrasonic wave generated from the projector 33 (including oscillators 33a–33c as shown in FIG. 4B) is propagated through a developer liquid 34 and applied to a (glass) substrate 31 carrying a pre-baked and exposed color filter material layer while being uniformized by the rotating reflection-and-diffusion plate 32 as shown in FIG. 4B in contrast with a propagation state obtained in the absence of such a reflection-and-diffusion plate 32 as shown in FIG. 4A.

In a specific Example, a layer of color filter material comprising a pigment dispersed in a photosensitive polyamide ("PA-1000", available from Ube Kosan K.K.) was formed in a thickness of 1.8 μm, pre-baked at 80° C. for 10 min. and exposed on a 1.1 mm-thick glass substrate 31.

The substrate 31 carrying the exposed color filter material layer was dipped in a developer liquid 34 of ethyl cellosolve and supplied with an ultrasonic wave of 25 kHz generated from the ultrasonic projector 33 while rotating a 0.5 mm-thick reflection-and-diffusion plate 32 of SUS gently (at 20 rpm) right above the ultrasonic projector 33.

Figure 4B:
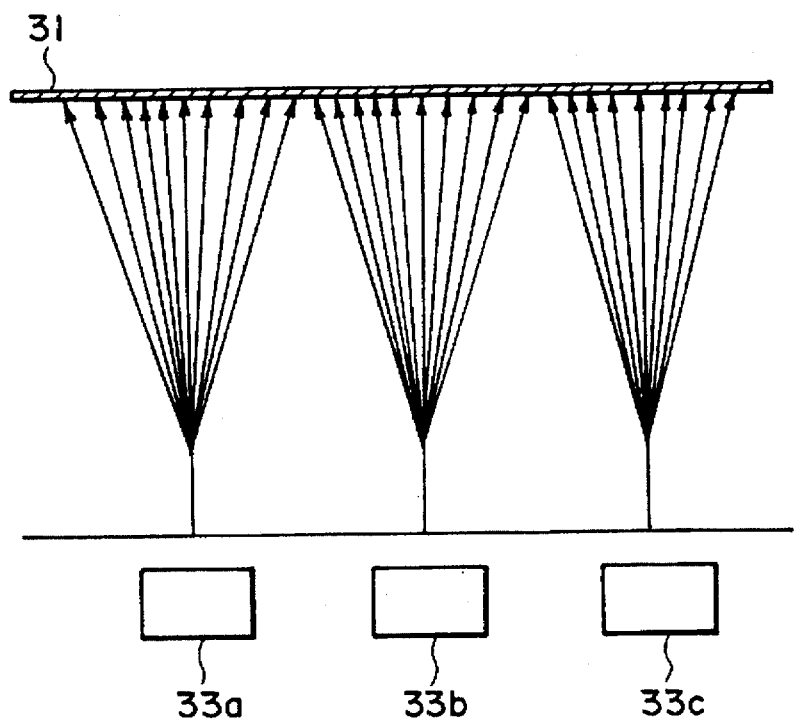

As a result, the ultrasonic wave having a strong directionality was uniformized and uniformly projected onto the substrate as illustrated in FIG. 4B, so that uniform development was effected.

EXAMPLE 5

FIG. 5 shows a modified reflection-and-diffusion plate 32a having random-shaped perforations 56 disposed at random. Such a modified reflection-and-diffusion plate 32a may be used in place of each piece of the reflection-and-diffusion plate 32 shown in FIG. 3 so as to promote the random reflection and diffusion of ultrasonic wave. The modified reflection-and-diffusion plate 32a may also be preferably rotated at a rate of 5 rpm to 20 rpm.

What is claimed is:

1. A developing apparatus for developing a pre-baked and exposed layer of a color filter material comprising a colorant dispersed in a photosensitive resin formed on a substrate to leave a color filter pattern on the substrate; said developing apparatus comprising:

a means for containing a developer liquid in which the substrate is dipped, a projection means for projecting a vibrating wave toward the substrate, and a means including at least two rotatable plates and disposed between the projection means and the substrate for reflecting or diffusing the vibrating wave.

2. An apparatus according to claim 1, wherein said at least two rotatable plates have perforations.

3. An apparatus according to claim 1, wherein said projection means is an ultrasonic wave projection means.

4. An apparatus according to claim 1, wherein said projection means projects an ultrasonic wave having an oscillation frequency of 5 kHz to 1 MHz.

5. An apparatus according to claim 1, wherein said projection means is disposed at a constant distance of 20 to 50 mm from the substrate.

6. An apparatus according to claim 1, wherein said at least two rotatable plates each have a thickness of at most 3 mm.

7. An apparatus according to claim 1, wherein said at least two rotatable plates each have a thickness of 1.0 to 1.5 mm.

8. An apparatus according to claim 1, wherein said at least two rotatable plates each comprise stainless steel.

9. An apparatus according to claim 1, wherein said at least two rotatable plates each are rotatable at 5 to 20 rpm.

10. A developing apparatus for developing an exposed layer of a photosensitive resin material formed on a substrate to leave a pattern of the layer on the substrate; said developing apparatus comprising:

a means for containing a developer liquid in which the substrate is dipped;

a projection means for projecting a vibrating wave toward the substrate; and a means including at least two rotatable plates and disposed between the projection means and the substrate for reflecting or diffusing the vibrating wave.

11. An apparatus according to claim 10, wherein said photosensitive resin material contains a colorant dispersed therein to form a color filter material.

12. An apparatus according to claim 10, wherein said at least two rotatable plates each have perforations.

13. An apparatus according to claim 10, wherein said projection means is an ultrasonic wave projection means.

14. An apparatus according to claim 10, wherein said projection means projects an ultrasonic wave having an oscillation frequency of 5 kHz to 1 MHz.

15. An apparatus according to claim 10, wherein said projection means is disposed at a constant distance of 20 to 50 mm from the substrate.

16. An apparatus according to claim 10, wherein said at least two rotatable plates each have a thickness of at most 3 mm.

17. An apparatus according to claim 10, wherein said at least two rotatable plates each have a thickness of 1.0 to 1.5 mm.

18. An apparatus according to claim 10, wherein said at least two rotatable plates each comprise stainless steel.

19. An apparatus according to claim 10, wherein said at least two rotatable plates each are rotatable at 5 to 20 rpm.

* * * * *

UNITED STATES PATENT AND TRADEMARK OFFICE
CERTIFICATE OF CORRECTION

PATENT NO. : 5,701,544

DATED : December 23, 1997

INVENTOR(S) : KAZUYA ISHIWATA, ET AL.

It is certified that error appears in the above-identified patent and that said Letters Patent is hereby corrected as shown below:

<u>COLUMN 1</u>

Line 16, "phillic" should read --philic--.

<u>COLUMN 5</u>

Line 9, "reflection-and diffusion"
          should read --reflection-and-diffusion--;
    Line 10, "a" should read --an--; and
    Line 19, "view point." should read --viewpoint.--.

<u>COLUMN 7</u>

Line 39, "layer 2" should read --layer 12--.

<u>COLUMN 8</u>

Line 25, "formed" should read --found--; and
    Line 49, "substrate 1" should read --substrate 21--.

Signed and Sealed this

Thirteenth Day of October 1998

*Attest:*

BRUCE LEHMAN

*Attesting Officer*     *Commissioner of Patents and Trademarks*